United States Patent
Shirakawa

(10) Patent No.: US 8,570,802 B2
(45) Date of Patent: Oct. 29, 2013

(54) NONVOLATILE SEMICONDUCTOR MEMORY DEVICE CAPABLE OF SPEEDING UP WRITE OPERATION

(75) Inventor: Masanobu Shirakawa, Chigasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/235,396

(22) Filed: Sep. 18, 2011

(65) Prior Publication Data

US 2012/0287710 A1 Nov. 15, 2012

(30) Foreign Application Priority Data

May 12, 2011 (JP) .................................. 2011-107533

(51) Int. Cl.
*G11C 11/34* (2006.01)
*G11C 16/04* (2006.01)
*G11C 16/06* (2006.01)

(52) U.S. Cl.
USPC ............ 365/185.03; 365/185.17; 365/185.22; 365/185.24; 365/185.28

(58) Field of Classification Search
USPC ............ 365/185.03, 185.17, 185.22, 185.24, 365/185.28
See application file for complete search history.

(56) References Cited

U.S. PATENT DOCUMENTS

| | | | |
|---|---|---|---|
| 6,567,315 B2 | 5/2003 | Takase et al. | |
| 6,859,401 B2 | 2/2005 | Hosono et al. | |
| 7,342,825 B2 | 3/2008 | Takeuchi et al. | |
| 7,646,639 B2 * | 1/2010 | Lee et al. | 365/185.08 |
| 7,881,110 B2 | 2/2011 | Park | |
| 8,050,097 B2 | 11/2011 | Wang | |
| 8,320,187 B2 | 11/2012 | Nagao | |
| 2006/0123295 A1 | 6/2006 | Tanaka | |
| 2008/0062770 A1 * | 3/2008 | Tu et al. | 365/185.28 |
| 2008/0253181 A1 * | 10/2008 | Edahiro et al. | 365/185.03 |
| 2009/0168533 A1 * | 7/2009 | Park et al. | 365/185.17 |
| 2009/0257282 A1 | 10/2009 | Kamei et al. | |
| 2009/0296469 A1 * | 12/2009 | Guterman | 365/185.03 |
| 2010/0020602 A1 | 1/2010 | Baek et al. | |
| 2010/0020614 A1 * | 1/2010 | Tu et al. | 365/185.11 |
| 2010/0061148 A1 | 3/2010 | Komatsu | |
| 2010/0074022 A1 * | 3/2010 | Liao | 365/185.18 |
| 2010/0097858 A1 | 4/2010 | Tokiwa et al. | |
| 2010/0142271 A1 * | 6/2010 | Honma et al. | 365/185.03 |
| 2010/0232228 A1 | 9/2010 | Jeon et al. | |
| 2011/0026331 A1 | 2/2011 | Dong et al. | |
| 2011/0051520 A1 | 3/2011 | Kim | |
| 2011/0085379 A1 * | 4/2011 | Kim | 365/185.03 |
| 2012/0002472 A1 * | 1/2012 | Futatsuyama | 365/185.09 |

FOREIGN PATENT DOCUMENTS

JP 2010-102755 5/2010

* cited by examiner

*Primary Examiner* — Ly D Pham
(74) *Attorney, Agent, or Firm* — Oblon, Spivak, McClelland, Maier & Neustadt, L.L.P.

(57) ABSTRACT

According to one embodiment, a nonvolatile semiconductor memory device includes a memory cell array, write circuit, memory unit, and voltage generation unit. A plurality of strings is arranged in the memory cell array, each of which includes a plurality of memory cells connected to word lines. The write circuit selects a first string selected as a sample from the memory cell array, and writes data to the memory cell. The memory unit holds, for each word line, the number of write operations to each memory cell of the first string. When data is written to each memory cell of a second string other than the first string, the voltage generation unit generates an initial write voltage based on the number of write operations, which corresponds to the selected word line and is read out from the memory unit.

27 Claims, 11 Drawing Sheets

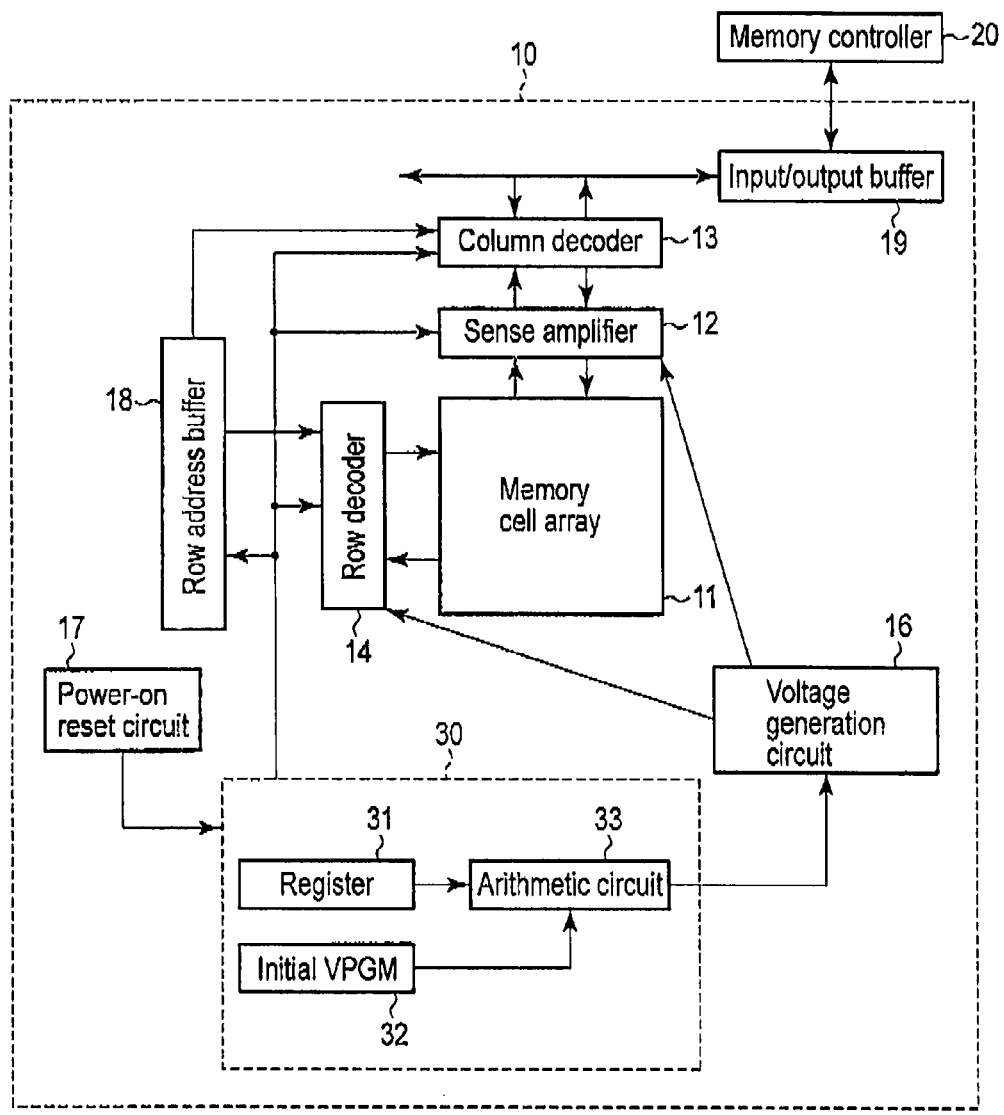
F I G. 1

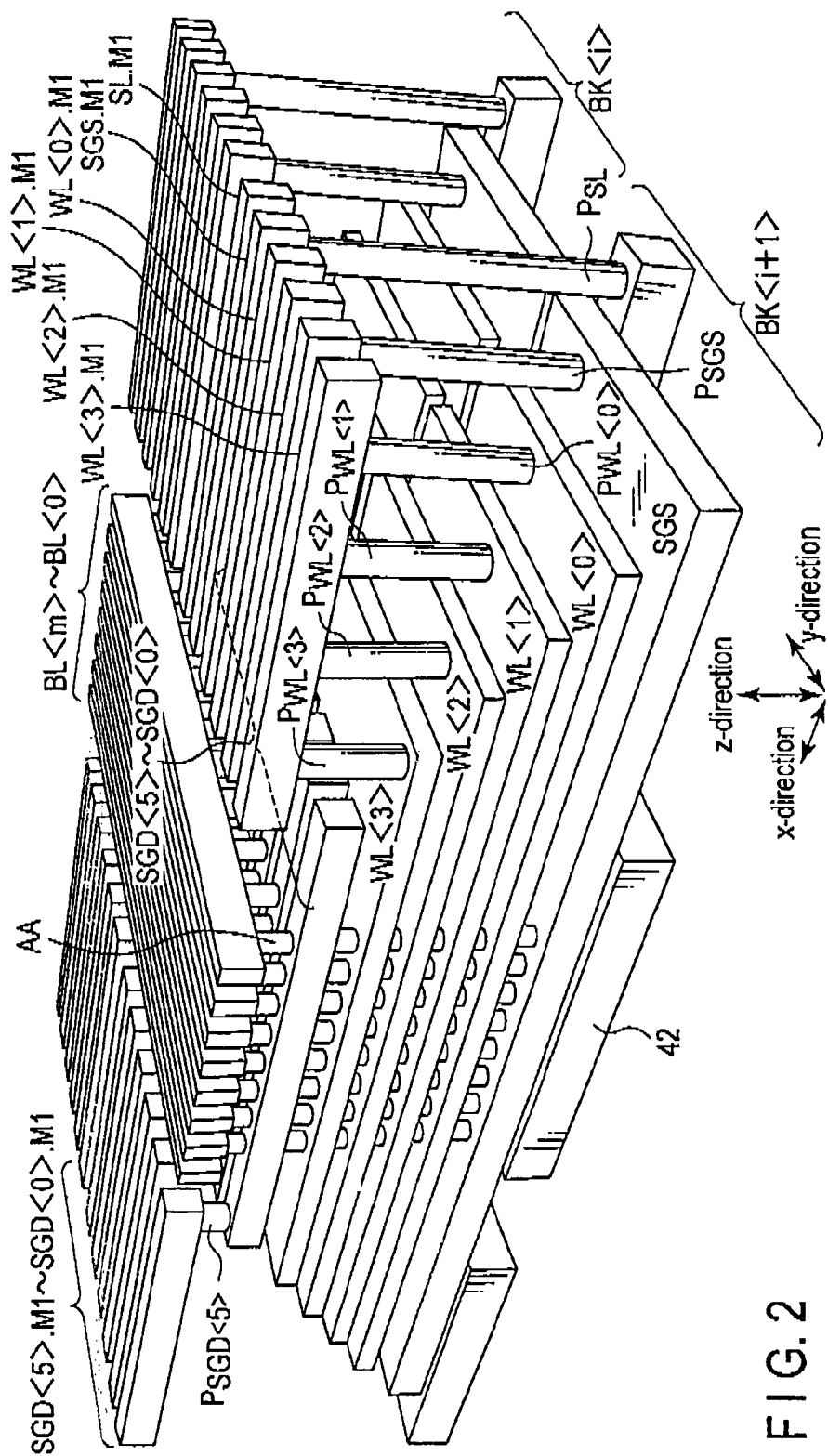
F I G. 2

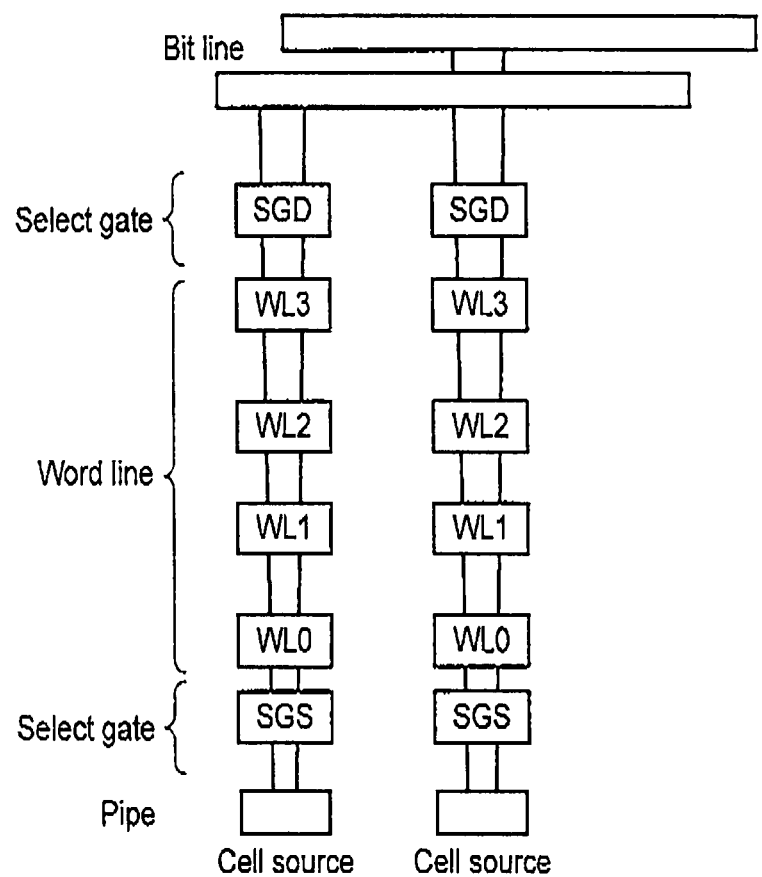
F I G. 3

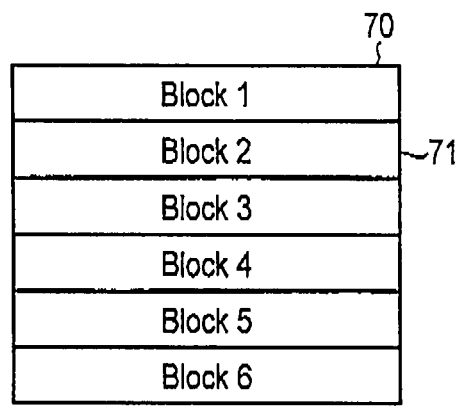
F I G. 7
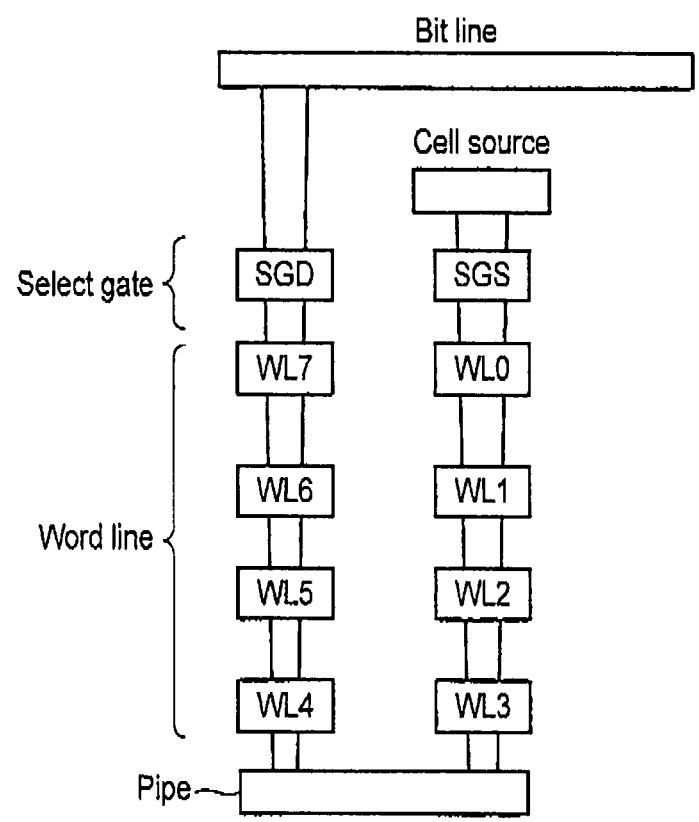
F I G. 9

NONVOLATILE SEMICONDUCTOR MEMORY DEVICE CAPABLE OF SPEEDING UP WRITE OPERATION

CROSS-REFERENCE TO RELATED APPLICATIONS

This application is based upon and claims the benefit of priority from prior Japanese Patent Application No. 2011-107533, filed May 12, 2011, the entire contents of which are incorporated herein by reference.

FIELD

Embodiments described herein relate generally to a nonvolatile semiconductor memory device having a stacked memory cell structure.

BACKGROUND

A stacked NAND flash memory formed by stacking memory cells, that is, a so-called bit-cost scalable (BiCS) memory has recently been proposed as an approach to improve the bit density of a NAND flash memory.

BRIEF DESCRIPTION OF THE DRAWINGS

FIG. 1 is a circuitry block diagram showing a nonvolatile semiconductor memory device according to the first embodiment;

FIG. 2 is a perspective view illustrating an example of the element structure of the nonvolatile semiconductor memory device shown in FIG. 1;

FIG. 3 is a sectional view schematically showing the structures of two NAND strings of the nonvolatile semiconductor memory device shown in FIG. 1;

FIG. 7 is a view illustrating an example of a plurality of memory blocks arranged in one chip;

FIG. 9 is a sectional view schematically showing the structure of one NAND cell string of a nonvolatile semiconductor memory device according to the second embodiment;

DETAILED DESCRIPTION

Figure 4B:
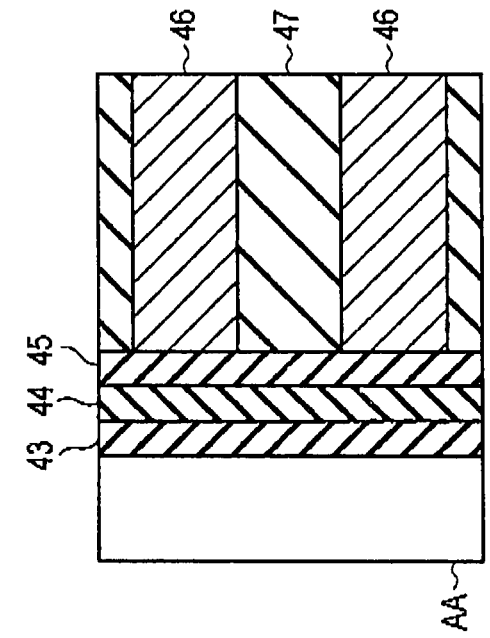
FIG. 4B is a partial enlarged view of FIG. 4A.

In general, according to one embodiment, a nonvolatile semiconductor memory device includes a memory cell array, write circuit, memory unit, and voltage generation unit. A plurality of strings is arranged in the memory cell array, each of which includes a plurality of memory cells connected in series with each other. The write circuit selects a first string selected as a sample from the memory cell array, and writes data to the memory cell. The memory unit holds, for each word line, the number of write operations to each memory cell of the first string. When each memory cell of a second string other than the first string is selected, and data is written to the memory cell of the second string, the voltage generation unit generates an initial write voltage based on the number of write operations, which corresponds to the selected word line and is read out from the memory unit.

Embodiments will be described below with reference to the accompanying drawings. The same reference numerals denote the same parts throughout the drawings.

First Embodiment

Background of First Embodiment

When a BiCS memory includes multiple layers which are formed at once by one lithography process, its fabrication cost can be kept overwhelmingly lower than that of a conventional three-dimensional memory. On the other hand, since a silicon pillar serving as an active layer AA has a diameter which decreases in the direction of depth, a cell in the uppermost layer and that in the lowermost layer have different write characteristics. Therefore, the number of applications of write pulses may vary in each individual layer, so the write performance is likely to considerably vary in each individual layer. Furthermore, when the chip area is increased to achieve a high capacity, a variation in the in-plane direction is likely to occur.

Also, stress concentrates on a layer applied which a large number of write pulses. Therefore, a write failure, for example, may occur on a page for which write and erase are repeated. If even one page suffers from a failure, a block including this page becomes a bad block, thus shortening the life of this block.

In view of this, this embodiment provides a semiconductor memory device which improves a write operation to a memory cell to speed up the write operation while reducing the frequency of generation of bad blocks.

In a BiCS memory, memory cells which are arranged in different layers in the direction of depth are expected to have different characteristics, whereas those which are arranged in the same layer in the direction of depth are expected to have the same characteristics. Furthermore, even in a mass memory, a plurality of memory cells in the same block are expected to have little variation in the in-plane direction.

Accordingly, in this embodiment, an index (for example, the number of applications of write pulses) which reflects the layer-specific write characteristics of a given sample string is held. The above-mentioned index of a given layer in the sample string is reflected on a write operation for writing data to other strings on a page of the same layer as the sample string. Note that the sample string does not always mean a dedicated string, and may be a string which is to be written and is designated first after, for example, power-on.

[Arrangement of Nonvolatile Semiconductor Memory Device]

FIG. 1 is a circuitry block diagram illustrating an example of a three-dimensional stacked nonvolatile semiconductor memory device according to the first embodiment.

The three-dimensional stacked nonvolatile semiconductor memory device according to this embodiment includes a BiCS flash memory 10 and memory controller (also, referred to as an external controller hereinafter) 20.

<BiCS Flash Memory>

The BiCS flash memory 10 includes a memory cell array 11, sense amplifier 12, column decoder 13, row decoder 14, voltage generation circuit 16, power-on reset circuit or power-on detection circuit 17, row address buffer 18, input/output buffer 19, and control circuit (also referred to as an internal controller hereinafter) 30.

<<Memory Cell Array>>

FIGS. 2, 3, 4A, and 4B show the arrangement (a perspective view and sectional views) of the memory cell array 11 in this embodiment.

The memory cell array 11 includes a plurality of blocks. FIG. 2 shows only two blocks BK<i> and BK<i+1>, for the sake of descriptive convenience. A data erase operation is performed for, for example, each block. Note that a generic block will be referred to as a block BK hereinafter.

As shown in FIG. 2, each block includes, for example, a source diffusion layer 42, a source-side select gate line SGS which is formed above the source diffusion layer 42 and serves as a conductive layer, word lines WL<0> to WL<3>, a drain-side select gate line SGD, and active layers AA, and forms a plurality of NAND strings.

The source diffusion layer 42 formed in a semiconductor substrate (not shown) is commonly provided in all blocks BK within, for example, the same plane. The source diffusion layer 42 is connected to a source line SL·M1 via a contact plug $P_{SL}$.

Also, three or more conductive layers made of, for example, conductive polysilicon are stacked on an interlayer dielectric film (not shown) formed on the source diffusion layer 42. Referring to FIG. 2, six conductive layers as mentioned above are formed on the interlayer dielectric film formed on the source diffusion layer 42. The respective conductive films serve as the source-side select gate line (second select gate line) SGS positioned in the lowermost layer, drain-side select gate lines (first select gate lines) SGD<0> to SGD<5> positioned in the uppermost layer, and word lines WL<0> to WL<3> which are arranged between the source-side select gate line SGS and the drain-side select gate line SGD.

The five conductive layers other than the drain-side select gate lines SGD<0> to SGD<5> in the uppermost layer are formed in plate shapes within one block BK. Also, the ends of the six conductive layers in the x-direction in FIG. 2 (the direction parallel to the surface of the semiconductor substrate) are formed in a staircase shape so that the conductive layers can come into contact with contact members. For example, word line WL<0> is formed above the source-side select gate line SGS but is not formed above the end of the source-side select gate line SGS so that the source-side select gate line SGS can come into contact with a contact member. That is, word line WL<0> is formed to have an x dimension smaller than the source-side select gate line SGS. Similarly, word line WL<1> is formed to have an x dimension smaller than word line WL<2>, word line WL<2> is formed to have an x dimension smaller than word line WL<3>, and word line WL<3> is formed to have an x dimension smaller than the drain-side select gate line SGD.

The drain-side select gate lines SGD<0> to SGD<5> in the uppermost layer are formed in bar shapes. The drain-side select gate lines SGD<0> to SGD<5> run in the x-direction with spacings between them in the y-direction, as shown in FIG. 2. In FIG. 2, one block is constituted by six strings. A string is selected by selecting one of the drain-side select gate lines SGD<0> to SGD<5> in a selected block address. When the string 0 is selected, SGD<0> is activated, for example.

<<Active Layer>>

As shown in FIG. 2, the plurality of active layers (active areas) AA are formed in pillar shapes so as to extend from the source diffusion layer 42 through the source-side select gate line SGS, word lines WL<0> to WL<3>, and drain-side select gate lines SGD<0> to SGD<5> in the z-direction (the direction perpendicular to the surface of the semiconductor substrate) in FIG. 2. The upper ends of the plurality of active layers AA are connected to a plurality of bit lines BL<0> to BL<m>, respectively, running in the y-direction.

Also, the source-side select gate line SGS is connected to a lead SGS·M1 running in the x-direction via a contact plug $P_{SGS}$, and word lines WL<0> to WL<3> are respectively connected to leads WL<0>·M1 to WL<3>·M1 running in the x-direction via contact plugs $P_{WL<0>}$ to $P_{WL<3>}$.

Moreover, the drain-side select gate lines SGD<0> to SGD<5> are respectively connected to leads SGD<0>·M1 to SGD<5>·M1 via contact plugs $P_{SGD<0>}$ to $P_{SGD<5>}$.

The plurality of bit lines BL<0> to BL<m> and leads SGS·M1, WL<0>·M1, WL<1>·M1 to WL<3>·M1, and SGD<0>·M1 to SGD<5>·M1 use, for example, metal interconnections.

FIG. 3 shows a sectional view of NAND strings in FIG. 2. The NAND string includes a plurality of memory cells connected to word lines WL0 to WL3, a source-side select gate transistor connected to the source-side select gate line SGS, and a drain-side select gate transistor connected to the drain-side select gate line SGD. Although FIG. 3 exemplifies only two NAND strings, the block BK as shown in FIG. 2 includes, for example, 12 NAND strings.

Figure 4A:
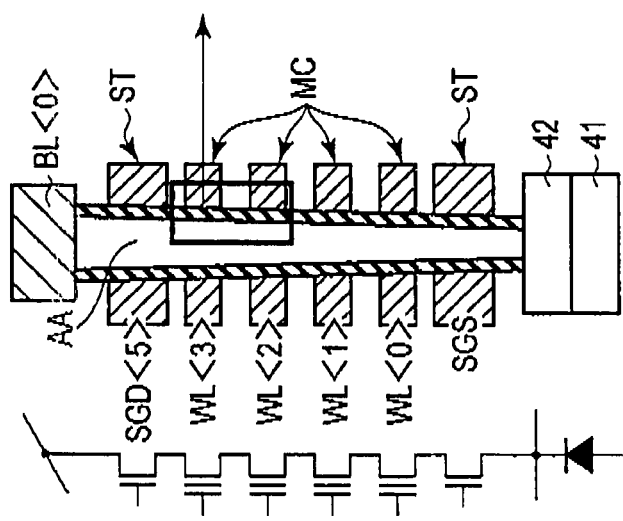
FIG. 4A is a sectional view showing the structure of one NAND string of the nonvolatile semiconductor memory device shown in FIG. 1.

FIG. 4A is a sectional view showing details of the structure of one NAND string, and FIG. 4B is a partial enlarged view of FIG. 4A.

Memory cells MC are formed at the intersection portions between word lines WL<0> to WL<3> and the active layer AA formed in a pillar shape in a direction perpendicular to the surface of a semiconductor substrate 41, as shown in FIG. 4A. Also, a source-side select gate transistor ST is formed at the intersection portion between the active layer AA and the source-side select gate line SGS, and a drain-side select gate transistor ST is formed at the intersection portion between the active layers AA and the drain-side select gate line SGD.

The memory cell MC has, for example, a MONOS structure. The MONOS structure means herein a memory cell structure in which a charge storage layer is formed from an insulator such as a nitride (for example, SiN). The structure of the memory cell MC is not limited to a MONOS structure, and may be another structure.

That is, the memory cell MC has an oxide-nitride-oxide (ONO) structure in which a charge storage layer 44 is formed between, for example, two insulating films 43 and 45, as shown in FIG. 4B. The insulating film 43 is interposed between the charge storage layer 44 and the active layer AA. The insulating film 43 functions as a tunnel insulating film in writing data, and prevents charges from leaking into the active layer AA in retaining the data. The insulating film 45 is interposed between the charge storage layer 44 and a pair of control gates 46. The insulating film 45 prevents charges trapped in the charge storage layer 44 from leaking into the control gates 46. The control gates 46 are connected to word line WL<3> and WL<2>, respectively. An interlayer dielectric film 47 is formed between the control gates 46.

Note that the memory cell MC may have an MNOS structure without the insulating film 45.

The select gate transistor ST has the same structure as, for example, the memory cell MC. However, the gate insulating films of the select gate transistor ST interposed between the active layer AA and the source-side select gate line SGS may have a structure different from the memory cell MC, that is, a structure without the charge storage layer 44, such as that having only a single silicon oxide film.

A set of memory cells MC which are included in the individual NAND strings, respectively, and share one word line WL, form a page to serve as the unit of data read and write. Also, a set of a plurality of NAND strings which share a plurality of word lines WL form a block to serve as the unit of data erase.

<<Sense Amplifier and Column Address Buffer/Column Decoder>>

The sense amplifier 12 is connected to the memory cells in the memory cell array 11 via bit lines BL, and connected to the column decoder 13 which simultaneously serves as a column address buffer, as shown in FIG. 1. The sense amplifier 12 reads out data from the memory cell array 11 for each page at the time of data read, and writes data to the memory cell array 11 for each page at the time of data write.

Also, the sense amplifier 12 includes a plurality of data latch circuits (not shown) in correspondence with the respective bit lines. These data latch circuits include three data latch circuits when a multilevel cell (MLC) which stores 2-bit data is used as each memory cell.

The column decoder 13 decodes a column address signal input via the row address buffer 18, and outputs a selection signal for selecting one of the bit lines BL to the sense amplifier 12, as will be described later. Also, the column decoder 13 supplies data read out from the sense amplifier 12 to the input/output buffer 19.

<<Row Decoder>>

The row decoder 14 decodes a row address signal input via the row address buffer 18, and selects and drives the word line WL and select gate lines SGD and SGS of the memory cell array 11.

Note that the BiCS flash memory 10 in this embodiment is provided with an external input/output terminal I/O (not shown), and exchanges data between the input/output buffer 19 and the memory controller 20 via the external input/output terminal I/O. An address signal input via the external input/output I/O is supplied to the row decoder 14 and column decoder 13 via the row address buffer 18.

<<Power-On Detection Circuit>>

The power-on detection circuit 17 is connected to a control circuit 15. The power-on detection circuit 17 detects power-on, and outputs a detection signal to the control circuit 30.

<<Control Circuit>>

Upon receiving a power-on detection signal input from the power-on detection circuit 17, the control circuit 30 automatically performs an initialization operation. The control circuit 30 controls a write operation, an erase operation, and a read operation for the memory cell array 11, based on various external control signals (for example, a write enable signal $WE_n$, a read enable signal $RE_n$, a command latch enable signal CLE, and an address latch enable signal ALE), and a command CMD.

Also, the control circuit 30 includes a register 31, memory 32, and arithmetic circuit 33. The register 31 holds an index which reflects the layer-specific write characteristics of each sample string. The register 31 holds, for example, the number of applications of write pulses for each word line WL as an index. The memory 32 stores an initial write voltage $V_{PGM}$. The arithmetic circuit 33 computes an optimum write voltage $V_{PGM}$ based on the index held in the register 31, and the initial write voltage $V_{PGM}$ stored in the memory 32.

<<Voltage Generation Circuit>>

The voltage generation circuit 16 generates various voltages required in write, erase, and read operations which are controlled by the control circuit 30, and includes a booster circuit to generate a voltage higher than a power supply voltage. The voltage generation circuit 16 is connected to the arithmetic circuit 33 of the control circuit 30, and generates a voltage based on the arithmetic result obtained by the arithmetic circuit 33.

Note that the sense amplifier 12, column decoder 13, row decoder 14, voltage generation circuit 16, and the control circuit 30 mainly constitute a write means and a read means.

<Memory Controller>

The memory controller 20 exchanges, for example, commands, data, and addresses with the BiCS flash memory 10.

[Operation of Nonvolatile Semiconductor Memory Device]

One notable feature of the above-mentioned three-dimensional structure is that the drain-side select gate line SGD<5> has a structure which surrounds the side surfaces of the pillar-shaped active layers AA. Therefore, even when, for example, the diameters of the plurality of active layers AA are decreased to form a larger number of active layers AA on the semiconductor substrate 41 so as to achieve a high capacity, a sufficient driving force can reliably be ensured for the select transistors which form the NAND strings.

The diameter of the silicon pillar serving as the active layer AA gets smaller toward the semiconductor substrate 41. Therefore, when, for example, the same threshold voltage is set for a memory cell positioned above the active layer AA and that positioned below the active layer AA, the upper memory cell and the lower memory cell may undergo different numbers of write operations. Hence, in this embodiment, the write voltage is controlled in the following way.

Figure 5:
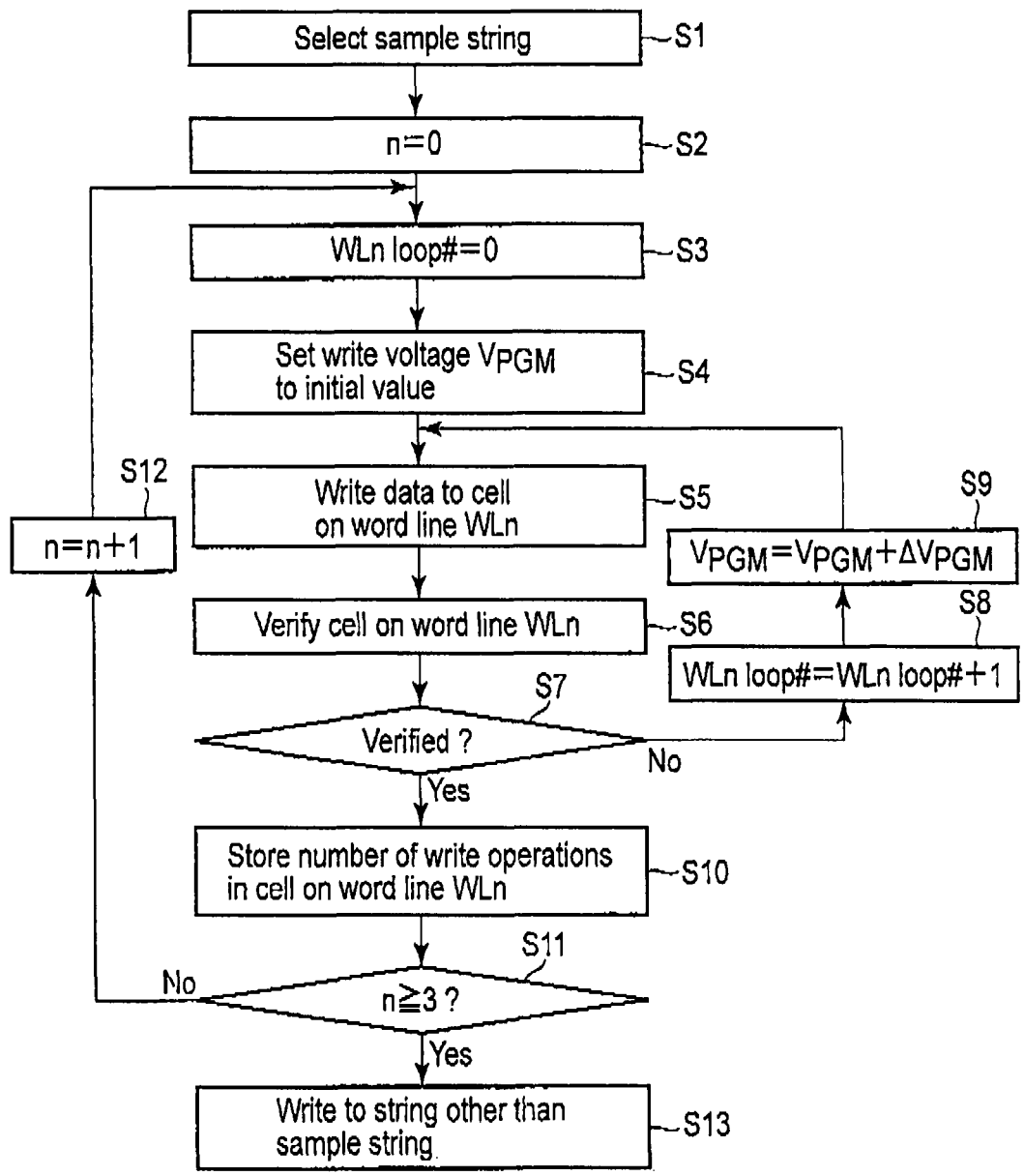
FIG. 5 is a flowchart showing the operation of the nonvolatile semiconductor memory device according to the first embodiment.

FIG. 5 shows the write operation of the nonvolatile semiconductor memory device in this embodiment. Note that for the sake of descriptive simplicity, a case in which four word lines, that is, word lines WL0 to WL3 are used, and four memory cells are stacked, as shown in FIGS. 3 and 4A, will be described below. Also, the number of applications of write pulses will be taken as an example of the index which reflects the layer-specific write characteristics of each sample string.

In this embodiment, in writing data to the memory cells, one NAND string is selected as a sample string from the plurality of NAND strings, the number of write operations (the number of applications of write pulses) required to set a predetermined threshold voltage for each memory cell of this NAND string is counted, and the obtained count value is held in the register 31. Thus, the register 31 holds the numbers of write operations to the memory cells for each word line of a given NAND string. After that, in writing data to each memory cell of a NAND string other than the sample string, the count value corresponding to the memory cell of the sample string, which is selected by the same word line as the memory cell to which data is to be written, is read out from the register 31, and the write voltage is corrected based on this count value. More specifically, the above-mentioned operation is executed in the following way.

When, for example, a sample string write command is issued from the memory controller 20, a row decoder 52 and a column decoder 53 select one NAND string as a sample string from the plurality of NAND strings based on this command (step S1).

After that, the control circuit 30 sets a parameter "n" used to select a word line WLn to an initial value n=0 (step S2), and sets a parameter "WLn loop#" used to count the number of write operations to an initial value WLn loop#=0 (step S3).

In this state, the voltage generation circuit 16 sets the write voltage $V_{PGM}$ to an initial value (step S4).

Next, the control circuit 30 applies the write voltage $V_{PGM}$ generated by the voltage generation circuit 16 to word line WL<0> of the selected sample string (step S5). At this time, 0 V, for example, is applied to the bit line BL connected to the sample string via the sense amplifier 12, and 0 V, for example, is applied to the active layer AA of the sample string. Therefore, charges are injected into the charge storage layer of the memory cell selected by word line WL<0>.

After the application of the write voltage $V_{PGM}$, it is verified whether the threshold voltage of the memory cell connected to word line WL<0> has reached a predetermined threshold voltage (steps S6 and S7). Note that the verify level used to obtain the count number need not have the same value as the verify level in a normal write operation. That is, a verify voltage is generated by the voltage generation circuit 16, the verify voltage is applied to word line WL<0>, and the sense amplifier 12 is used to verify whether the threshold voltage of the memory cell has reached the verify voltage. As a result, if the threshold voltage of the memory cell has not reached the verify voltage, that is, verify is NG, the write voltage is stepped up to repeat and the operations in steps S4 to S6.

More specifically, if it is determined that verify of the memory cell connected to word line WL<0> is NG, the number of applications of write pulses (WLn loop#) is counted up (WLn loop#=WLn loop#+1) (step S8).

After that, the voltage generation circuit 16 steps up the write voltage $V_{PGM}$ by $\Delta V_{PGM}$ to set the obtained stepped-up voltage as a new write voltage (step S9).

The new write voltage is applied to the memory cell connected to word line WL<0> (step S5), and a verify operation is then performed (steps S6 and S7). With this verify operation, every time it is determined that verify is NG, the write voltage $V_{PGM}$ is stepped up in steps of $\Delta V_{PGM}$, and a memory cell write verify operation is repeated (steps S7, S8, S9, S5, and S6).

On the other hand, if it is determined in step S7 that verify is OK, the number of write operations (WLn loop#) to the memory cell connected to word line WL<0> is held in the register 31 of the control circuit 30 (step S10).

It is determined whether write to all word lines of the sample string is complete (step S11). If NO is determined in step S11, n=n+1 is set (step S12), and the same operations as mentioned above are executed for the memory cell connected to the next word line WL<1>.

In this way, the number of write operations (WLn loop#) upon writing data to the memory cell connected to each of word lines WL<0> to WL<3> of the sample string is held in the register 31 of the control circuit 30. In other words, the register 31 stores the number of applications of write voltages (WLn loop#) until write for each of word lines WL<0> to WL<3> (for each layer) is completed.

If it is determined in step S11 that a condition n≥3 is satisfied, the pieces of information stored in the register 31 and memory 32 are used to write data to each memory cell of a NAND string other than the sample string (step S13).

That is, when a command output from the memory controller 20 is issued to write data to each memory cell of a NAND string other than the sample string, the control circuit 30 reads out, from the register 31, the number of write operations (WLn loop#) corresponding to the word line WL to which the memory cell designated by the command is connected, and supplies it to the arithmetic circuit 33. Further, the control circuit 30 supplies the initial value of the write voltage $V_{PGM}$ stored in the memory 32 to the arithmetic circuit 33. The arithmetic circuit 33 computes a write voltage $V_{PGM}$ optimum for the designated memory cell based on the supplied number of write operations (WLn loop#) and the initial value of the write voltage $V_{PGM}$. The computed write voltage $V_{PGM}$ is supplied to the voltage generation circuit 16. Therefore, the voltage generation circuit 16 can generate a write voltage $V_{PGM}$ optimum for the designated memory cell. Using the write voltage $V_{PGM}$ generated by the voltage generation circuit 16, data is written to each memory cell of the designated NAND string other than the sample string.

The initial write voltage (WLn Initial $V_{PGM}$) optimum for the memory cell connected to word line WLn (n=1 to 3) of the string other than the sample string is given by:

$$WLn \text{ Initial } V_{PGM} = (\text{Initial } V_{PGM}) + \{(WLn \text{ loop\#}) - W_m + 1\} \times \Delta V_{PGM}$$

where Initial $V_{PGM}$ is the initial write voltage common to each word line, WLn loop# is the number of write operations to the memory cell connected to word line WLn of the sample string, $W_m$ is the number of write operations (the required number of write operations) expected for the memory cell arranged in the string other than the sample string, and $\Delta V_{PGM}$ is the increment (step-up voltage) of the write voltage. The arithmetic circuit 33 computes this equation to obtain an optimum initial write voltage.

Figure 6:
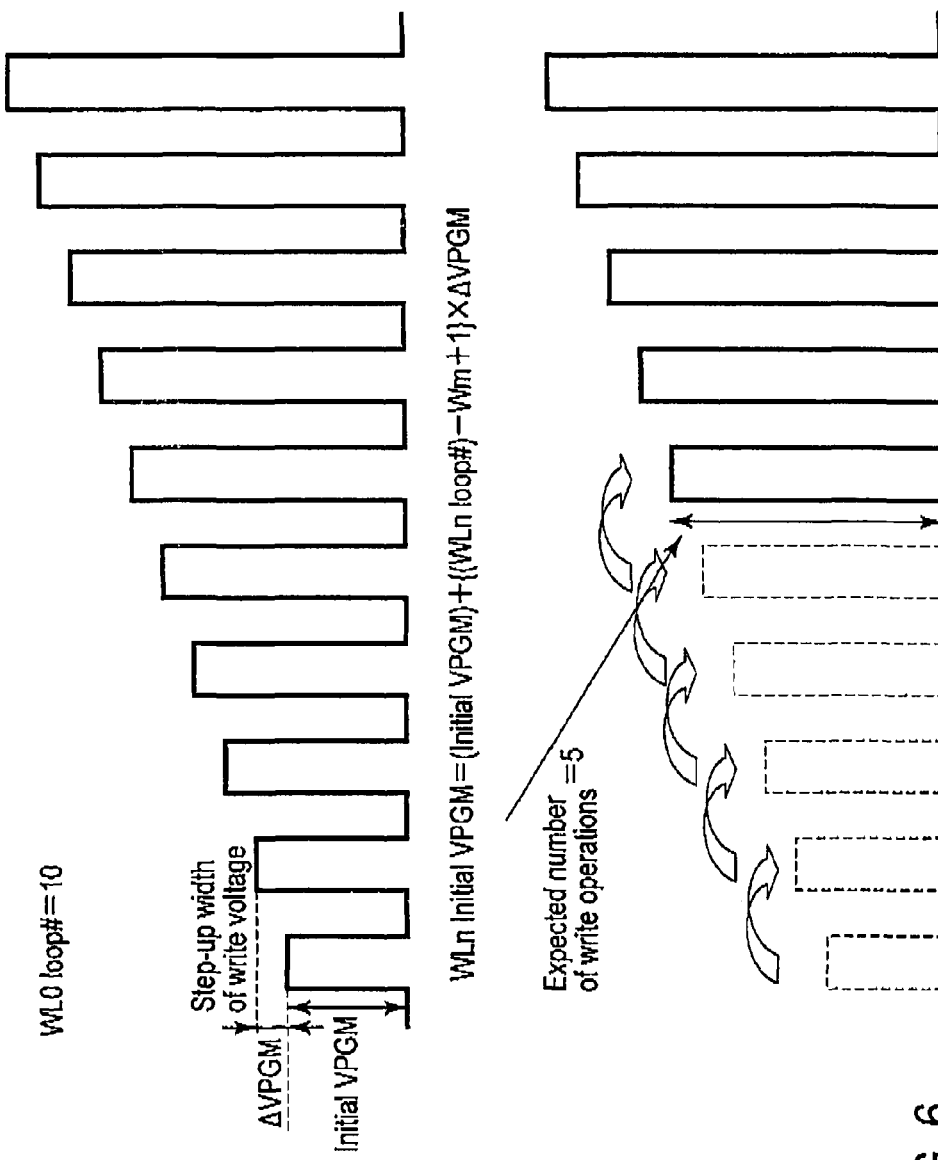
FIG. 6 is a view showing a change in write voltage $V_{PGM}$ according to the first embodiment.

FIG. 6 is a view showing a change in write voltage $V_{PGM}$ upon write. Assume, for example, that when the initial value of the write voltage $V_{PGM}$ is 10 V, and the step-up voltage $\Delta V_{PGM}$ is 1 V in writing data to the memory cell connected to word line WL0 of the sample string, the write voltage $V_{PGM}$ reaches 20 V when the number of write operations WLn loop# becomes 10.

In this case, the initial write voltage WL0 Initial $V_{PGM}$ optimum for the memory cell connected to, for example, word line WL0 of the string other than the sample string is computed using the above-mentioned equation as:

$$WL0 \text{ Initial } V_{PGM} = 10 \text{ V} + (10 - 5 + 1) \times 1\text{V} = 16 \text{ V}$$

where the expected number of write operations $W_m$ is, for example, 5.

In the above-mentioned equation, to complete write by five write operations, the number of write operations is (10−5). In this case, write starts from WL0 Initial $V_{PGM}$=15 V, so the write voltage $V_{PGM}$ reaches 20 V upon the sixth write operation.

Therefore, to complete write by five write operations, the initial write voltage WL0 Initial $V_{PGM}$ is incremented by "+1" to start write from WL0 Initial $V_{PGM}$=16 V.

Note that even if the individual memory cell characteristics have a variation, the layer-specific memory cell write characteristics can be uniformed by obtaining and applying the initial write voltage WLn Initial $V_{PGM}$ corrected based on the value obtained by the above-mentioned equation.

For each of the memory cells connected to the word lines subsequent to word line WL0, an optimum initial write voltage WLn Initial $V_{PGM}$ can similarly be calculated based on the required number of write operations, the actual number of write operations, the write voltage $V_{PGM}$ of the sample string, and the step-up voltage $\Delta V_{PGM}$.

In this manner, by obtaining the number of write operations for each word line (layer) of the sample string, an optimum initial write voltage WLn Initial $V_{PGM}$ can be set in writing data to the string other than the sample string.

Note that as shown in FIG. 7, a NAND flash memory includes a plurality of blocks 71 in one chip 70, so memory cells in the same layer within the same block are expected to have characteristics with little variation. Thus, it is extremely effective to use pieces of information, which are obtained by writing data to the sample string, to write data to the memory cells in the same layer within the same block. Also, memory cells in different blocks are expected to have different characteristics even if they are present in the same layer. Thus, a sample string need only be selected for each block to obtain the number of write operations for each layer.

The operation of holding, in the register 31, the number of write operations to each memory cells within the sample string is not limited to that executed before the start of a write operation, and may be executed upon power-on of the nonvolatile semiconductor memory device or for every predetermined cycle.

Moreover, the numbers of write operations can also be stored in, for example, each NAND string of the memory cell array 11. In this case, the number of write operations can also be updated by storing the number of write operations by performing the above-mentioned operation or periodically issuing sample string write commands, both at the time of a test after the manufacture of a nonvolatile semiconductor memory device.

Effect of First Embodiment

According to the first embodiment, in a nonvolatile semiconductor memory device which uses a BiCS memory, the number of write operations (the number of pulses) to the sample string for each layer is held in the register 31, and the held information is reflected on the initial value of the write voltage in writing data to the memory cells of other NAND strings in the same layer. Therefore, an initial write voltage optimum for a given memory cell in each layer can be set. This makes it possible not only to uniform the layer-specific memory cell write characteristics, but also to decrease the number of write pulses and the number of times of verify, thus raising the write speed.

Also, a NAND flash memory having a three-dimensional structure, such as a BiCS memory, may be more vulnerable to program disturb than a NAND flash memory having a two-dimensional structure. However, according to this embodiment, the number of write pulses can be decreased, so the program disturb can be reduced, thus making it possible to improve the chip reliability.

[Modification]

Figure 8:
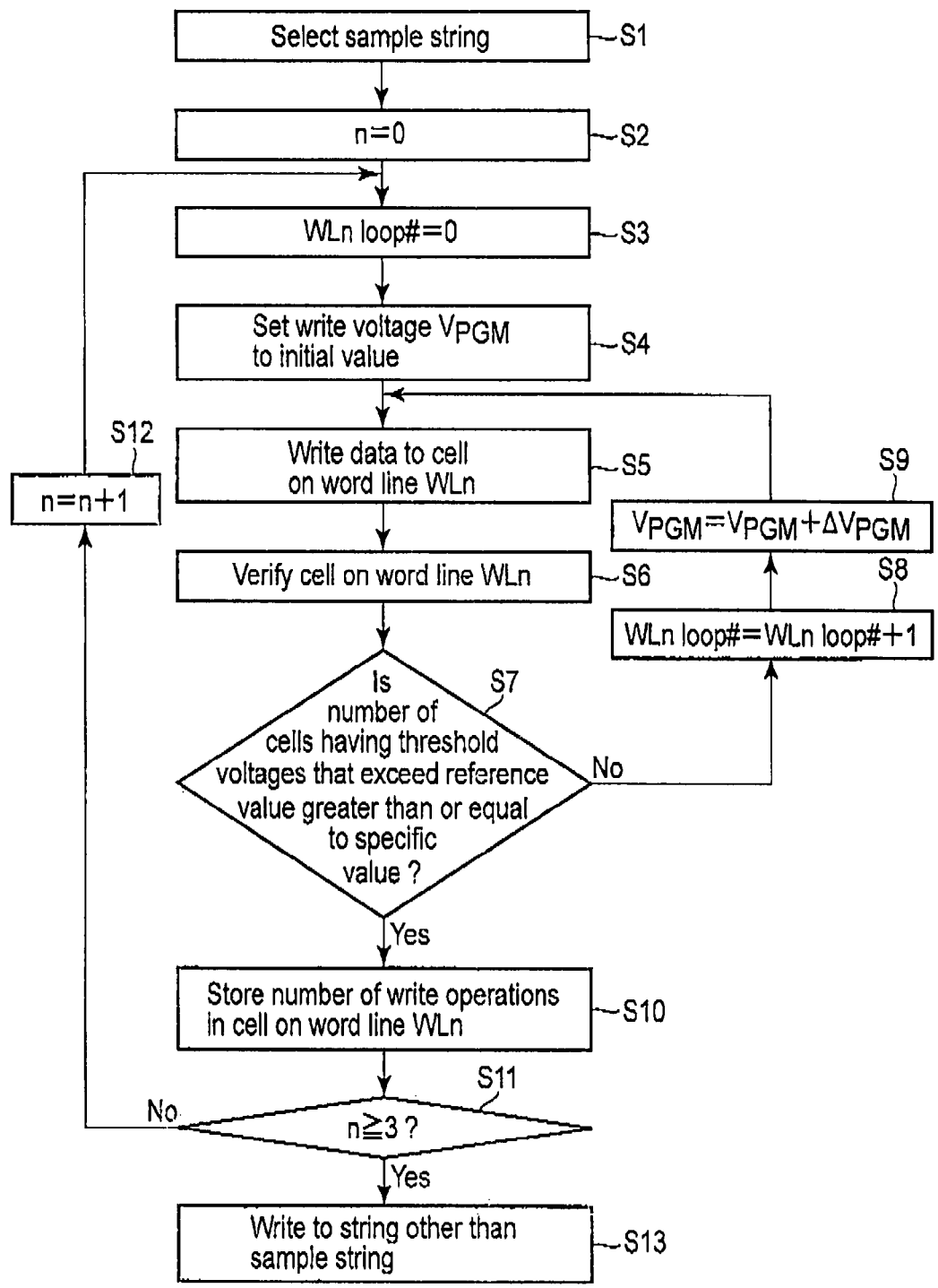
FIG. 8 is a flowchart showing a modification to the first embodiment.

FIG. 8 shows a modification to the first embodiment. The same reference numerals as in FIG. 5 denote the same parts in FIG. 8, and a description of only different parts will be given.

In the first embodiment, the memory cell connected to the nth word line WL of the sample string is programmed and verified. After that, it is determined whether verify is complete, and, if it is determined that verify is incomplete, the write voltage $V_{PGM}$ is stepped up to write data to this memory cell again. This operation is repeated until verify is completed, and the number of write operations is counted.

In contrast to this, in the modification, the number of memory cells for which it is determined that verify is OK is counted, write is repeated upon stepping up the write voltage $V_{PGM}$ until the count number of cells becomes greater than or equal to a specific value, and the number of write operations WLn loop# is counted.

That is, as shown in FIG. 8, after the write voltage $V_{PGM}$ is applied to the nth word line of the selected sample string within the selected block BK (step S5), the control circuit 30 determines whether the threshold voltage of the memory cell connected to the nth word line WL is greater than or equal to a reference value (step S6). After that, it is determined whether the number of cells having threshold voltages that exceed the reference value is greater than or equal to a specific value (step S7). If it is determined in step S7 that the number of cells has not reached the specific value, the operations in steps S4 to S6 are repeated until the number of cells becomes greater than or equal to the specific value.

That is, if it is determined in step S7 that the number of cells having threshold voltages that are greater than or equal to the reference value is smaller than the specific value, the number of write operations is counted up (WLn loop#=WLn loop#+1) (step S8). After that, the write voltage $V_{PGM}$ is stepped up by $\Delta V_{PGM}$ (step S9). The obtained stepped-up write voltage is applied to the memory cell connected to the nth word line WL (step S5). This operation is repeated every time it is determined in step S7 that the number of cells having threshold voltages that are greater than or equal to the reference value is smaller than the specific value.

On the other hand, if it is determined in step S7 that the number of cells having threshold voltages that are greater than or equal to the reference value has become greater than or equal to the specific value, the number of write operations (WLn loop#) of the memory cell connected to the nth word line WL is held in the register 31 of the control circuit 30 (step S10).

Subsequently, by the same operations as in the first embodiment, the number of write operations (WLn loop#) in writing data to the memory cell connected to each of word lines WL0 to WL3 of the sample string is held in the register 31 of the write control circuit 30. Also, data is written to each cell of a string other than the sample string using an optimum write voltage $V_{PGM}$ computed for each layer using the pieces of information stored in the register 31 and memory 32.

According to the above-mentioned modification as well, the same effect as in the first embodiment can be obtained. In addition, according to this modification, because a series of write operations is ended when the number of cells having threshold voltages that are greater than or equal to a reference value has become greater than or equal to a specific value, write and verify operations can be speeded up compared to a case in which verify completion of all memory cells is determined, and this is effective in a BiCS memory having a high memory capacity.

Second Embodiment

A BiCS memory cell has been described in detail in the above-mentioned first embodiment. In contrast to this, the second embodiment shows a case in which the present innovation is applied to a p-BiCS memory including four-layered word lines WL0 to WL3 and word lines WL4 to WL7, as shown in, for example, FIG. 9. Note that the p-BiCS memory uses, as one NAND string, the cells on word lines WL0 to WL7 by connecting the lowermost portions of the active layers of two adjacent NAND strings via a pipe P1 formed from a conductive layer. In this p-BiCS memory, select gate lines SGD and SGS are provided above the two active layers. That is, the select gate line SGD is formed above the word line VL, and the select gate line SGS is formed above word line WL7. The uppermost portion of the active layer, which is provided with the select gate line SGD, is connected to a bit line, and that of the active layer, which is provided with the select gate line SGS, is connected to a cell source.

One active layer sequentially extends through word lines WL0, WL1, WL2, and WL3, and the other active layer sequentially extends through word lines WL7, WL6, WL5, and WL4. Therefore, word lines WL0 and WL7, word lines WL1 and WL6, word lines WL2 and WL5, and word lines WL3 and WL4 are expected to have similar write characteristics.

Accordingly, in the second embodiment, the number of write operations (the number of pulses) in setting a predetermined threshold voltage for each memory cell is registered in a register 31 using word lines WL0, WL1, WL2, and WL3, and initial write voltages in write which uses word lines WL7, WL6, WL5, and WL4 are generated using the numbers of write operations which are registered in the register 31.

Figure 10:
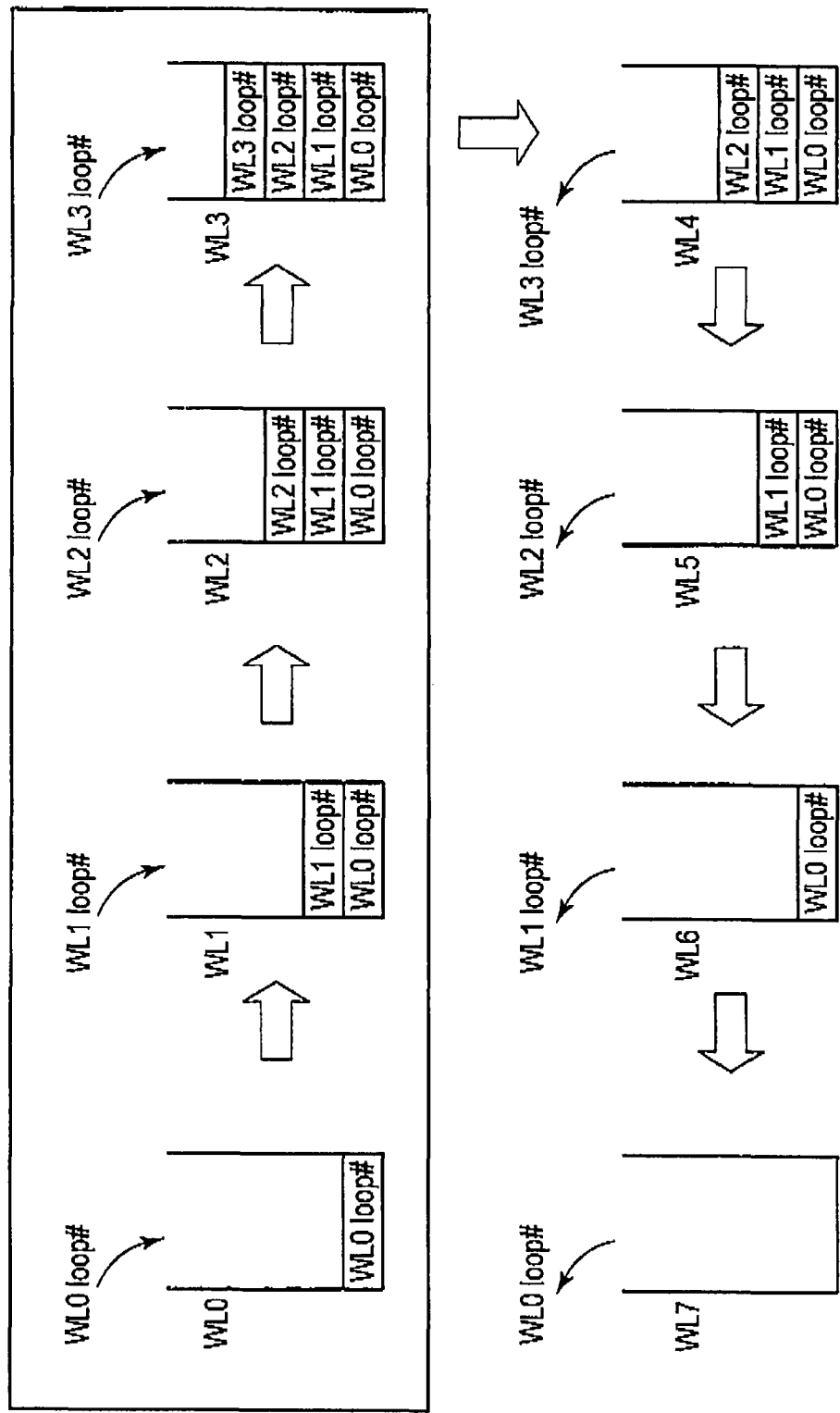
FIG. 10 is a schematic view for explaining a write operation according to the second embodiment.

FIG. 10 schematically shows the numbers of write operations WL0 loop#, WL1 loop#, WL2 loop#, and WL3 loop# which are recorded in the register 31 in correspondence with write operations to memory cells selected by word lines WL0, WL1, WL2, and WL3, and write operations to memory cells selected by word lines WL4, WL5, WL6, and WL7 using the numbers of write operations WL3 loop#, WL2 loop#, WL1 loop#, and WL0 loop# which are recorded in the register 31.

In this manner, in the second embodiment, the numbers of write operations WL0 loop#, WL1 loop#, WL2 loop#, and WL3 loop# which are recorded in the register 31 in correspondence with write operations to memory cells selected by word lines WL0, WL1, WL2, and WL3 are reflected on the initial write voltages used in writing data to word lines WL4, WL5, WL6, and WL7. In other words, pages selected by word lines WL0, WL1, WL2, and WL3 are defined as sample pages, and the numbers of write operations recorded in the register 31 in correspondence with the respective sample pages are reflected on the initial write voltages in writing data to the memory cell on the pages selected by word lines WL7, WL6, WL5, and WL4. This makes it possible to match the write characteristics of memory cells selected by word lines WL0, WL1, WL2, and WL3 with those of memory cells selected by word lines WL7, WL6, WL5, and WL4, respectively.

An operation for reflecting the numbers of write operations of sample pages selected by word lines WL0, WL1, WL2, and WL3 on the initial write voltages of pages selected by word lines WL7, WL6, WL5, and WL4, respectively, will be described next.

If the number of write operations to word line WL0 is, for example, 10, word line WL7 is expected to undergo about 10 write operations.

Hence, if the expected number of write operations to word line WL7 is 5, the initial write voltage of word line WL7 is obtained by five step-up operations of the step-up voltage $\Delta V_{PGM}$ from the initial write voltage of word line WL0.

In other words, in general, when the number of write operations to a given layer of each sample page is defined as n, and write to a different page of the same layer is to be completed by m write operations, the initial write voltage applied to the different page of the same layer is obtained by (n−m) step-up operations of the step-up voltage $\Delta V_{PGM}$ from the initial write voltage of the sample page.

To execute the above-mentioned operation, a last in, first out (LIFO) register, for example, is used as the register 31.

FIG. 10 illustrates an example of a write operation which uses a LIFO register. After write operations to word line WL0, the number of write operations WL0 loop# to word line WL0 is registered in the LIFO register. Also, after write operations to word lines WL1, WL2, and WL3, the numbers of write operations WL1 loop#, WL2 loop#, and WL3 loop#, respectively, are sequentially registered in the LIFO register. The numbers of write operations WL3 loop#, WL2 loop#, WL1 loop#, and WL0 loop# which are registered in the LIFO register are reflected on the initial values of the write voltages of word lines WL4, WL5, WL6, and WL7. The use of LIFO allows reflection of the result obtained by word line WL3 on word line WL4, reflection of the result obtained by word line WL1 on word line WL6, and reflection of the result obtained by word line WL0 on word line WL7.

Also, although the above-mentioned operation may be done for each individual string in the second embodiment, a string including word lines WL0 to WL3 of one P-BiCS memory may be set as a sample string to reflect the numbers of write operations to this string on other strings. In this case, based on the numbers of write operations to the sample string, the write voltages $V_{PGM}$ of word lines WL4 to WL7 in this string and word lines WL0 to WL7 in other strings can optimally be set, thus making it possible to further decrease the number of write pulses and speed up a write operation compared to the first embodiment.

Modification to Second Embodiment

The second embodiment is applicable not only to a p-BiCS structure but also to a BiCS structure. That is, the second embodiment is applicable to two adjacent NAND strings in a normal BiCS structure shown in FIG. 3. In this case, word lines WL0 to WL3 of one NAND string are sequentially selected, and write operations to this NAND string are performed. With these write operations, the number of write operations for each word line is sequentially registered in the register. When write to one NAND string is complete, word lines WL0 to WL3 of an adjacent NAND string are sequentially selected, and write operations to this NAND string are performed. In this case, the numbers of write operations which are registered in the register are sequentially read out to generate initial write voltages.

Figure 11:
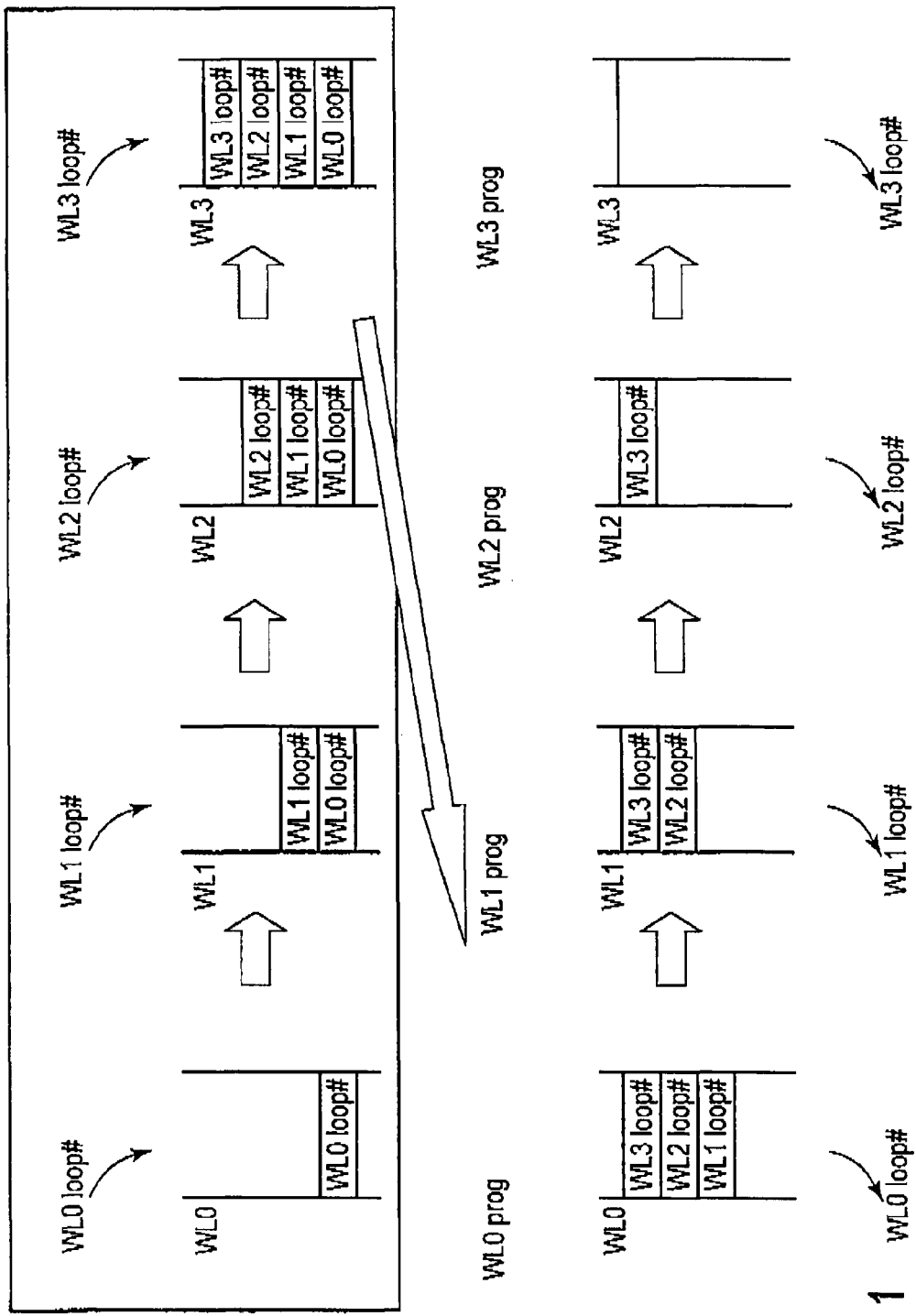
FIG. 11 is a schematic view for explaining another example of a write operation according to the second embodiment.

FIG. 11 shows a modification to the second embodiment. In the modification to the second embodiment, a first in, first out (FIFO) register is used as the register in place of a LIFO register, as shown in FIG. 11. That is, word lines WL0 to WL3 of one NAND string are sequentially selected, and write operations to this NAND string are performed. With these write operations, the numbers of write operations WL0 loop#, WL1 loop#, WL2 loop#, and WL3 loop# are sequentially registered in the FIFO register in correspondence with word lines WL0 to WL3, respectively. After that, when word lines WL0 to WL3 of an adjacent NAND string are sequentially selected, the numbers of write operations WL0 loop#, WL1 loop#, WL2 loop#, and WL3 loop# which are registered in the FIFO register are sequentially read out to generate initial write voltages based on the readout numbers of write operations WL0 loop#, WL1 loop#, WL2 loop#, and WL3 loop3.

According to this modification as well, the same effect as in the second embodiment can be obtained.

Third Embodiment

A case in which binary or two-valued (1-bit) data is written to each memory cell has been described in the above-mentioned first and second embodiments. In contrast to this, a multilevel BiCS memory in which ternary or three-or-more-valued (2-or-more-bit) data is written to each memory cell will be described in the third embodiment.

Figure 12:
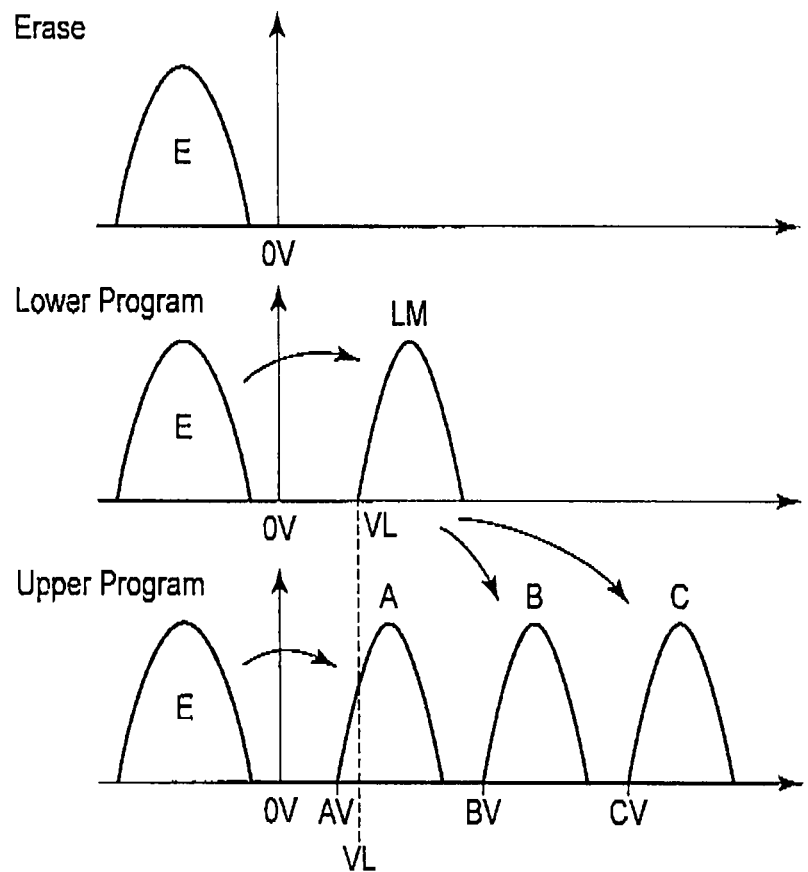
FIG. 12 is a schematic graph showing a change in threshold voltage upon writing data to a multilevel memory according to the third embodiment.

FIG. 12 illustrates an example in which 2-bit data, for example, is written to a given memory cell. In case of 2-bit data, lower bit data is written first (lower page program). After that, upper bit data is written (upper page program).

In writing lower bits, if the lower bit data is "0", the cell state is written upon a change from erase state "E" to state "LM". The write of the cell state upon a change to state "LM" uses verify voltage VL.

Also, in writing upper bits, if the lower bit data is "1" and the upper bit data is "0", the cell state is written upon a change from erase state "E" to state "A"; or if the lower bit data is "0" and the upper bit data is "0", the cell state is written upon a change from state "LM" to state "C". At this time, state "LM" also changes to state "B". The write of upper bit data uses verify voltages "AV", "BV", and "CV".

This write scheme utilizes the fact that verify voltage "VL" in state "LM" is close to verify voltage "AV" in state "A".

In a multilevel BiCS memory, the number of write operations of lower bits is registered in the register. In writing upper bits, the number of write operations of the lower bits is read out to set an initial write voltage based on the readout number of write operations.

In, for example, writing lower bits to a word line WL0 of the sample string, assume that the cell state is written upon a change from erase state "E" to state "LM" by, for example, 10 write operations at an initial write voltage $V_{PGM}$=10 V and a step-up voltage $\Delta V_{PGM}$=1 V.

In this case, in writing upper bits, assume that the cell state is to be written upon a change from erase state "E" to state "A" by keeping the number of write operations as small as, for example, five. Then, in writing lower bits to word line WL0 of the above-mentioned sample string, an optimum initial write voltage Initial $V_{PGM}$ is computed using an index in writing the cell state upon a change from erase state "E" to state "LM".

More specifically, the optimum initial write voltage Initial $V_{PGM}$ can be obtained by:

$$\text{Initial } V_{PGM} = V_{PGM} + \Delta V_{PGM} \times (10-5+1) = 16 \text{ V}$$

In this way, an optimum initial write voltage Initial $V_{PGM}$ for upper bits can be set based on the write result of lower bits. Word line WL1 and subsequent word lines can undergo the same operations as in word line WL0. Especially in this write scheme, verify voltage "VL" in state "LM" and verify voltage "AV" in state "A" are close to each other, so the optimum initial write voltage Initial $V_{PGM}$ for upper bits can be set based on the write result of lower bits. This makes it possible to decrease the number of write pulses and the number of times of verify, thus raising the write speed.

Also, by storing the number of write operations obtained for each layer, and applying it to write to a string other than the sample string, the number of write pulses can be decreased, and a write operation can be speeded up, as in the first embodiment.

Fourth Embodiment

Figure 13:
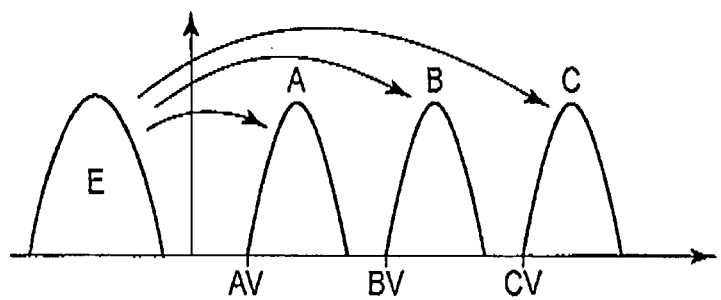
FIG. 13 is a schematic graph showing a change in threshold voltage upon writing data to a multilevel memory according to the fourth embodiment.

FIG. 13 shows the fourth embodiment, in which another example of a multilevel BiCS memory is given.

In the third embodiment, the cell state is written upon classifying data into lower bits and upper bits. In contrast to this, the fourth embodiment uses a scheme of writing each type of bit at once.

That is, by writing data to a memory cell in an erase state once, the memory cell is set in one of states "A", "B", and "C" (A<B<C) based on the written data, as shown in FIG. 13.

Note that in writing data to the memory cell connected to a word line WL0 of the sample string, assume, for example, that state "A" requires 15 write operations, state "B" requires 25 write operations, and state "C" requires 30 write operations, all at an initial write voltage Initial $V_{PGM}$=10 V and a step-up voltage $\Delta V_{PGM}$=1 V. These numbers of write operations are registered in a register 31. The numbers of write operations to the memory cells connected to a word line WL1 and subsequent word lines are similarly registered in the register 31.

After that, in writing data to the memory cell connected to a word line WL0 of a NAND string other than the sample string by keeping the number of write operations in state "A" as small as, for example, five, an optimum initial write voltage Initial $V_{PGM}$ can be obtained by $$\text{Initial } V_{PGM} = V_{PGM} + \Delta V_{PGM} \times (15-5+1) = 21 \text{ V}$$

For each of the memory cells connected to word line WL1 and subsequent word lines, an initial write voltage Initial $V_{PGM}$ can similarly be obtained.

According to the fourth embodiment, an optimum initial write voltage Initial $V_{PGM}$ can be set for each of word lines WL0 to WL3 of the sample string in writing, to the memory cell connected to the same word line of a NAND string other than the sample string, the state of this memory cell based on the number of write operations obtained for each state. Therefore, even when multilevel data is to be set by one write operation, the number of write pulses can be decreased, and a write operation can be speeded up, as in the first embodiment.

Note that in each embodiment, the arrangement of a memory cell array is not always limited to a BiCS or p-BiCS memory, and these embodiments are applicable to a stacked memory device formed by stacking memory cells on a semiconductor substrate.

Also, the structure of a BiCS memory is not limited to that shown in FIG. 1, and can be changed as needed.

Moreover, although a case in which the threshold voltage in erase state "E" is negative has been taken as an example in the third and fourth embodiments, these embodiments are applicable when the threshold voltage in erase state "E" is positive, thus producing the same effect.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
a memory cell array including a first string and a second string, the first string including a plurality of first memory cells, the second string including a plurality of second memory cells, the plurality of first memory cells being connected to first word lines respectively, the plurality of second memory cells being connected to second word lines respectively, the plurality of first memory cells and the plurality of second memory cells being stacked above a semiconductor substrate; and
a controller configured to control a first program operation and a second program operation, the controller configured to supply a first voltage to a selected first word line at a beginning of the first program operation,
the controller configured to supply a second voltage to the selected first word line after supplying the first voltage, the second voltage being generated by adding a step-up voltage to the first voltage in the first program operation,
the controller configured to supply a third voltage to a selected second word line at the beginning of the second program operation after the first program operation, a difference between the first voltage and the third voltage being substantially k (k is natural number) times width of the step-up voltage.

2. The device according to claim 1, wherein if a threshold voltage of the memory cell has not reached a verify voltage, the controller steps up a program voltage, and executes the first and second program operations, the program voltage including the first voltage, the second voltage, and the third voltage.

3. The device according to claim 1, wherein if the number of memory cells having threshold voltages that exceed a verify voltage is smaller than a first value, the controller steps up a program voltage, and executes the first and second program operations.

4. The device according to claim 3, wherein the first and second strings are formed by stacking the plurality of first and second memory cells above the semiconductor substrate.

5. The device according to claim 3, wherein the first and second strings comprise:
a first portion in which the plurality of first memory cells and a first select gate are stacked above a semiconductor substrate while sharing a first pillar portion, the plurality of first memory cells are connected to first word lines, and the first select gate is connected to a first select gate line;
a second portion in which the plurality of second memory cells and a second select gate are stacked above the semiconductor substrate while sharing a second pillar portion, the plurality of second memory cells are connected to second word lines, and the second select gate is connected to a second select gate line;
a third portion which is provided in the semiconductor substrate and configured to electrically connect the first pillar portion and the second pillar portion;
a bit line connected to the first portion via the first select gate; and
a source line connected to the second portion via the second select gate.

6. The device according to claim 5, wherein the selected first word line is a same layer as the selected second word line.

7. The device according to claim 5, wherein the first string comprises the plurality of first memory cells and a first select gate stacked above a semiconductor substrate while sharing a first pillar portion, and the second string comprises the plurality of second memory cells and a second select gate stacked above the semiconductor substrate while sharing a second pillar portion.

8. The device according to claim 7, wherein the selected first word line is a same layer as the selected second word line.

9. The device according to claim 3, wherein each of the plurality of memory cells stores data of not less than 2 bits, and the memory unit stores the first number of first program operations for each of the first word lines and the second number of the second program operations for each of the second word lines.

10. The device according to claim 9, wherein in writing data of a first bit, the controller generates an initial program voltage used to program the data of the first bit, based on the first and second numbers.

11. The device according to claim 1, further comprising:
a voltage generation unit, the controller configured to control the voltage generation unit.

12. The device according to claim 11, wherein the controller comprises:
a first storing unit configured to store the number of write pulses for the first string;
a storing unit configured to store an initial program voltage; and
an arithmetic unit configured to calculate an optimum program voltage based on the number of program pulses from the first storing unit and the initial program voltage from the storing unit.

13. The device according to claim 11, wherein the arithmetic unit calculates the initial program voltage WLn Initial $V_{PGM}$ of the selected word line based on $$WLn\text{ Initial }V_{PGM}=(\text{Initial }V_{PGM})+\{(WLn\text{ loop\#})-W_m+1\}\times \Delta V_{PGM}$$

where the Initial VPGM is the initial program voltage, the WLn loop# is the number of program operations, the $W_m$ is the number of program operations of the second string, and the $\Delta V_{PGM}$ is an increment of the program voltage.

14. The nonvolatile semiconductor memory device according to claim 1, the memory cell array including a plurality of blocks, each block including a plurality of strings, the plurality of strings including the first string and the second string, the plurality of strings being connected a plurality of bit lines, one of the bit lines being connected to a plurality of strings in each block.

15. The device according to claim 1, wherein the number of first word lines is L (L is natural number), the number of second word lines is L, and the controller is configured to select M-th (M is natural number, M is equal to or less L) second word line as the selected second word line when the controller is configured to select M-th first word line as the selected first word line.

16. A nonvolatile semiconductor memory device comprising:
a memory cell array including a plurality of blocks, each block including a plurality of strings, the plurality of strings including a first string and a second string, the first string including a plurality of first memory cells, the second string including a plurality of second memory cells, the plurality of first memory cells being connected to first word lines respectively, the plurality of second memory cells being connected to second word lines respectively, the plurality of first memory cells and the plurality of second memory cells being stacked above a semiconductor substrate; and
a controller configured to control a first program operation and a second program operation, the controller configured to supply a first voltage to a selected first word line at a beginning of the first program operation,
the controller configured to supply a second voltage to the selected first word line after supplying the first voltage, the second voltage being generated by adding a step-up voltage to the first voltage in the first program operation,
the controller configured to supply a third voltage to a selected second word line at the beginning of the second program operation after the first program operation, a difference between the first voltage and the third voltage being substantially k (k is a natural number) times width of the step-up voltage.

17. The device according to claim 16, wherein if a threshold voltage of the memory cell has not reached a verify voltage, the controller steps up a program voltage, and executes the first and second program operations, the program voltage including the first voltage, the second voltage, and the third voltage.

18. The device according to claim 16, wherein if the number of memory cells having threshold voltages that exceed a verify voltage is smaller than a first value, the controller steps up a program voltage, and executes the first and second program operations.

19. The device according to claim 18, wherein the first and second strings are formed by stacking the plurality of first and second memory cells above the semiconductor substrate.

20. The device according to claim 18, wherein the first and second strings comprise:
   a first portion in which the plurality of first memory cells and a first select gate are stacked above a semiconductor substrate while sharing a first pillar portion, the plurality of first memory cells are connected to first word lines, and the first select gate is connected to a first select gate line;
   a second portion in which the plurality of second memory cells and a second select gate are stacked above the semiconductor substrate while sharing a second pillar portion, the plurality of second memory cells are connected to second word lines, and the second select gate is connected to a second select gate line;
   a third portion which is provided in the semiconductor substrate and configured to electrically connect the first pillar portion and the second pillar portion;
   a bit line connected to the first portion via the first select gate; and
   a source line connected to the second portion via the second select gate.

21. A method of controlling a nonvolatile semiconductor memory system, the nonvolatile semiconductor memory system including a memory cell array, the memory cell array including a first string and a second string, the first string including a plurality of first memory cells, the second string including a plurality of second memory cells, the plurality of first memory cells being connected to first word lines respectively, the plurality of second memory cells being connected to second word lines respectively, the plurality of first memory cells and the plurality of second memory cells being stacked above a semiconductor substrate, the method comprising:
   executing a first program operation; and
   executing a second program operation;
   applying a first voltage to a selected first word line at the beginning of the first program operation, and applying a second voltage to the selected first word line after applying the first voltage in the first program operation, the second voltage being generated by adding a step-up voltage to the first voltage, and
   applying a third voltage to a selected second word line at the beginning of the second program operation after the first program operation, a difference between the first voltage and the third voltage being substantially k (k is natural number) times width of the step-up voltage.

22. The method according to claim 21, wherein if a threshold voltage of the memory cell has not reached a verify voltage,
   a program voltage is stepped up, and
   the first and second program operations are executed,
   wherein the program voltage includes the first voltage, the second voltage, and the third voltage.

23. The method according to claim 21, wherein if the number of memory cells having threshold voltages that exceed a verify voltage is smaller than a first value,
   a program voltage is stepped up, and
   the first and second program operations are executed,
   wherein the program voltage includes the first voltage, the second voltage, and the third voltage.

24. The method according to claim 23, wherein the first and second strings are formed by stacking a plurality of memory cells above the semiconductor substrate.

25. The method according to claim 23, wherein the first and second strings comprise:
   a first portion in which the plurality of first memory cells and a first select gate are stacked above a semiconductor substrate while sharing a first pillar portion, the plurality of first memory cells are connected to first word lines, and the first select gate is connected to a first select gate line;
   a second portion in which the plurality of second memory cells and a second select gate are stacked above the semiconductor substrate while sharing a second pillar portion, the plurality of second memory cells are connected to second word lines, and the second select gate is connected to a second select gate line;
   a third portion which is provided in the semiconductor substrate and configured to electrically connect the first pillar portion and the second pillar portion;
   a bit line connected to the first portion via the first select gate; and
   a source line connected to the second portion via the second select gate.

26. The method according to claim 23, wherein each of the plurality of memory cells stores data of not less than 2 bits, and the memory unit stores the first number of first program operations for each of the first word lines and the second number of the second program operations for each of the second word lines.

27. The method according to claim 26, wherein in writing data of a first bit, an initial program voltage used to program the data of the first bit is generated based on the first and second numbers.

* * * * *